US007198671B2

(12) United States Patent
Ueda

(10) Patent No.: US 7,198,671 B2
(45) Date of Patent: Apr. 3, 2007

(54) LAYERED SUBSTRATES FOR EPITAXIAL PROCESSING, AND DEVICE

(75) Inventor: Tetsuzo Ueda, Menlo Park, CA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/904,131

(22) Filed: Jul. 11, 2001

(65) Prior Publication Data

US 2003/0033974 A1   Feb. 20, 2003

(51) Int. Cl.
   *C30B 25/00*   (2006.01)
(52) U.S. Cl. .................. 117/84; 117/101; 117/950; 117/951; 117/952
(58) Field of Classification Search .............. 117/84, 117/101, 950, 951, 952
See application file for complete search history.

(56) References Cited

U.S. PATENT DOCUMENTS

| 3,922,703 | A | * | 11/1975 | Pankove ................. 257/76 |
| 4,312,921 | A | * | 1/1982 | Hirai et al. .............. 428/446 |
| 4,348,803 | A | * | 9/1982 | Sasaki .................... 438/479 |
| 4,395,438 | A | * | 7/1983 | Chiang .................. 438/791 |
| 4,511,816 | A | * | 4/1985 | Mikoshiba et al. ..... 310/313 A |
| 4,830,984 | A | * | 5/1989 | Purdes ................... 438/492 |
| 4,835,116 | A | * | 5/1989 | Lee et al. ............... 438/493 |
| 4,846,931 | A | * | 7/1989 | Gmitter et al. .......... 438/26 |

(Continued)

FOREIGN PATENT DOCUMENTS

DE   198 47 101   *   5/2000

JP   53028374   *   3/1978

(Continued)

OTHER PUBLICATIONS

Patent Abstracts of Japan. Abstract of JP 60-154524 (1985).*

(Continued)

*Primary Examiner*—Yogendra N. Gupta
*Assistant Examiner*—Matthew J. Song
(74) *Attorney, Agent, or Firm*—McDermott Will & Emery

(57) ABSTRACT

A substrate comprising at least two layers which have different thermal expansion coefficients (TECs) is used for subsequent epitaxial growth of semiconductors. A typical example is an epitaxial growth of III-V Nitride (InGaAlB-NAsP alloy semiconductor) on sapphire. Due to the thermal mismatch between III-V Nitrides and sapphire, epitaxially-processed wafers bow in a convex manner during cool down after the growth. A layered substrate compensates for the thermal mismatch between the epitaxial layered the top layer of the substrate, resulting in a flat wafer suitable for subsequent processing at high yields. The layered substrate is achieved by attaching to the back side of the substrate a material which has a lower TEC, for example silicon on the backside of the sapphire, to reduce or eliminate the bowing. Silicon is attached or grown on a sapphire wafer by such as wafer bonding or epitaxial growth. Since the above attachment process is done at an elevated temperature, the sapphire on silicon structure may bow in a convex manner at room temperature due to the thermal mismatch. Hence, for the subsequent growth of GaN on the sapphire on silicon wafer, direct heating is desirable rather than heating on a heat sink material. Another example is simultaneous epitaxial growths of GaN on a front side and silicon on the backside of the sapphire. A special growth system for this double-sided growth is also described.

11 Claims, 11 Drawing Sheets

U.S. PATENT DOCUMENTS

| | | | | |
|---|---|---|---|---|
| 5,081,519 | A | * | 1/1992 | Nishimura ................... 257/200 |
| 5,227,331 | A | * | 7/1993 | Westmoreland ............. 438/680 |
| 5,290,393 | A | * | 3/1994 | Nakamura ................... 438/509 |
| 5,356,831 | A | * | 10/1994 | Calviello et al. ........... 117/105 |
| 5,562,770 | A | * | 10/1996 | Chen et al. .................. 438/202 |
| 5,620,557 | A | * | 4/1997 | Manabe et al. ............. 438/507 |
| 5,679,152 | A | * | 10/1997 | Tischler et al. ............... 117/97 |
| 5,753,551 | A | * | 5/1998 | Sung .......................... 438/253 |
| 5,913,974 | A | * | 6/1999 | Habuka .......................... 117/3 |
| 5,919,305 | A | * | 7/1999 | Solomon ...................... 117/90 |
| 6,086,673 | A | * | 7/2000 | Molnar ......................... 117/90 |
| 6,110,279 | A | * | 8/2000 | Kito et al. ................... 117/105 |
| 6,110,811 | A | * | 8/2000 | Pey ............................. 438/592 |
| 6,153,010 | A | * | 11/2000 | Kiyoku et al. ................ 117/95 |
| 6,232,137 | B1 | * | 5/2001 | Sugawara et al. ............ 438/46 |
| 6,316,361 | B1 | * | 11/2001 | Hansson ..................... 438/680 |
| 6,768,175 | B1 | * | 7/2004 | Morishita et al. ........... 257/352 |

FOREIGN PATENT DOCUMENTS

| | | | |
|---|---|---|---|
| JP | 60-154524 | * | 8/1985 |
| JP | 10335700 A | * | 12/1998 |
| WO | WO 9965068 A1 | * | 12/1999 |
| WO | WO 00/19500 A1 | * | 4/2000 |

OTHER PUBLICATIONS

Olsen et al. "Calculated stresses in multilayered heteroepitaxial structures", Jun. 1977, Journal of Applied Physics, vol. 48, No. 6, pp. 2543-2547.*

Olsen et al. "Calculated stresses in multilayered heteroepitaxial structures", Journal of Applied Physics, vol. 48, No. 6, Jun. 1977, pp. 2543-2547.*

Patent Abstracts of Japan. English Abstract of JP 53-028374 (1978).*

* cited by examiner (a)

(b)

(c)

US 7,198,671 B2

LAYERED SUBSTRATES FOR EPITAXIAL PROCESSING, AND DEVICE

BACKGROUND OF THE INVENTION

This invention generally relates to a layered substrate structure for subsequent epitaxial growth of a III-V nitride semiconductor. The III-V nitride semiconductor is a III-V compound semiconductor which contains nitrogen as an element, and is written as InGaAlBNAsP alloy ($In_xGa_yAl_zB_wN_\alpha As_\beta P_\gamma$ alloy, where $x+y+z+w=1$, $\alpha+\beta+\gamma=1$, and $0<=x,y,w,\alpha,\beta,\gamma<=1$). Such wide band gap III-V nitrides are widely used for visible light emitting diodes (LEDs) in many applications. The excitation of fluorescent material using blue or ultraviolet LEDs could enable the emission of white light, which could replace current light bulbs with bulbs with longer lifetimes. A high-density optical disk system is also a promising application of blue or ultraviolet semiconductor lasers using III-V nitrides. At present, test systems of high density optical disks are available using III-V nitride ultraviolet lasers.

A conventional substrate for the formation of III-V nitrides is sapphire on which III-V nitrides are grown by using metal organic chemical vapor deposition (MOCVD). Improvements in crystal quality have been seen by inserting a buffer layer grown at a low temperature between the substrate and a layer grown at a high temperature. Another alternative substrate is silicon carbide, however, SiC is still more expensive than sapphire even though SiC contains more crystal defects.

A prior art substrate and subsequent epitaxial growth process using III-V nitrides by MOCVD is explained with FIGS. 1A–1D. FIG. 1A shows an illustration of a prior art MOCVD system for epitaxial growth of III-V nitrides. Trimethyl-gallium(TMGa), trimethyl-aluminum(TMAl), trimethyl-indium(TMIn) and ammonia ($NH_3$) are used as source gases 112. Hydrogen is used as a carrier gas 113. A sapphire substrate 110 is placed on a susceptor 116 which is heated by using a radio frequency (RF) inductive heating system 118. Susceptor 116 is typically composed of graphite. Substrate 110 and susceptor 116 are both encased in a water-cooled reactor tube 114. RF inductive heating system 118 comprises an induction coil.

Referring to FIG. 1B, III-V nitride layers 122 are grown on a sapphire substrate 110 as seen in the cross sectional process flow. Typically, sapphire substrate 110 is 300 μm thick. Nitride layers 122 may include a GaN layer, an InGaN layer, and/or an AlGaN layer. First, a 50 nm thick AlN buffer layer is grown on sapphire substrate 110 at about 500° C. Then, epitaxial III-V nitride layers including a pn junction of InAlGaN alloys are grown on the AlN buffer layer. Typically, the epitaxial layers contain AlGaN cladding layers and InGaN quantum well active layers. After the growth of the III-V nitride layers, the resulting wafer is cooled down to room temperature and unloaded from reactor tube 114. At this point, the wafer exhibits bowing in a convex manner as illustrated in FIG. 1B. This bowing is caused by (1) the thermal mismatch between sapphire substrate 110 and nitride layers 122 and (2) the nitride layers 122 being affixed to sapphire substrate 110 at an elevated temperature.

Referring to FIG. 1C, the radius of the bowing can be calculated by using a simple model proposed by Olsen et. al., in which balance of forces and the momentum caused by the thermal mismatch are considered. FIG. 1C shows the calculated bowing for various GaN thicknesses based on the Olsen model. In this calculation, a simple two-layer model is used. The bowing becomes significant with the increase of the thickness of nitride layer 122 and can cause a significant decrease in yield.

Referring to FIG. 1D, the wafer is patterned through a photolithography process, followed by metallization, dielectric film deposition, and so on. With such a bowed wafer, fine patterning in the peripheral area is difficult and results in low yields for devices fabricated across the entirety of the wafer. FIG. 1D shows in cross-section an example of a light emitting diode (LED) fabricated in this manner from InGaN/AlGaN heterostructures. A pn junction structure is grown on sapphire substrate 110. Since sapphire is an insulating material, a p-type layer 136 and an active layer 134 are selectively etched, and a p-electrode 140 and a n-electrode 138 are formed. Typically, p-type layer 136 is composed of GaN or AlGaN. Typically, active layer 134 is composed of InGaN.

The epitaxial layer thickness 139 is limited to around a few microns in order to reduce the wafer bowing due to the thermal mismatch. Since the current flows through a very thin n-type layer 132, a series resistance 130 of the LED is high, resulting in high voltage operation. Typically, n-type layer 132 is composed of AlGaN or GaN. Even a small device chip may bow in a convex manner so that precise die bonding may be very difficult.

It is therefore highly desirable to provide a wafer which remains flat after III-V nitride growth and which is suitable for subsequent high-yield processing of high performance devices.

SUMMARY OF THE INVENTION

Accordingly, the present invention provides a flat wafer for high yield processing of III-V nitride devices. The present invention provides a structure and method for overcoming many of the aforesaid limitations of the prior art.

In an exemplary embodiment, the present invention uses a layered substrate for III-V nitride epitaxial growth, in which (1) each layer has a different thermal expansion coefficient (TEC) and (2) the TECs among the various layers are matched in order to compensate for any bowing which might otherwise occur.

In a somewhat different application, the layered substrate of the present invention may be used to provide a first substrate for subsequent epitaxial growth of semiconductors. In such an arrangement, the first substrate comprises at least two layers which have different TECs.

The method of the present invention may be used to result in a first semiconductor device. The first semiconductor device comprises a device layer on a layered substrate in which at least two layers have different TECs.

In an exemplary embodiment, the present invention provides a first epitaxial growth method. The first epitaxial growth method comprises an epitaxial growth on a layered substrate in which at least two layers have different TECs, followed by a removal of the substrate after the growth.

Still further, the present invention provides a second epitaxial growth method which comprises an epitaxial growth on a front side of a substrate at an elevated temperature and another film formation or epitaxial growth on the backside of the substrate before or after the front side growth without cooling down to room temperature. In accordance with this second epitaxial growth method, the front side growth and the back side growth are done without cooling down to room temperature.

The present invention provides a third epitaxial growth method. The third epitaxial growth method comprises direct heating by a radiation source without any heat sink material of a layered substrate in which each layer has a different TEC.

In an alternative arrangement, the present invention provides a further epitaxial growth system in which films can be grown on both sides of a substrate simultaneously. In such an arrangement, a substrate is placed so that each side of the substrate is not covered by any parts or susceptor blocks.

DETAILED DESCRIPTION OF THE INVENTION

Figure 1A:
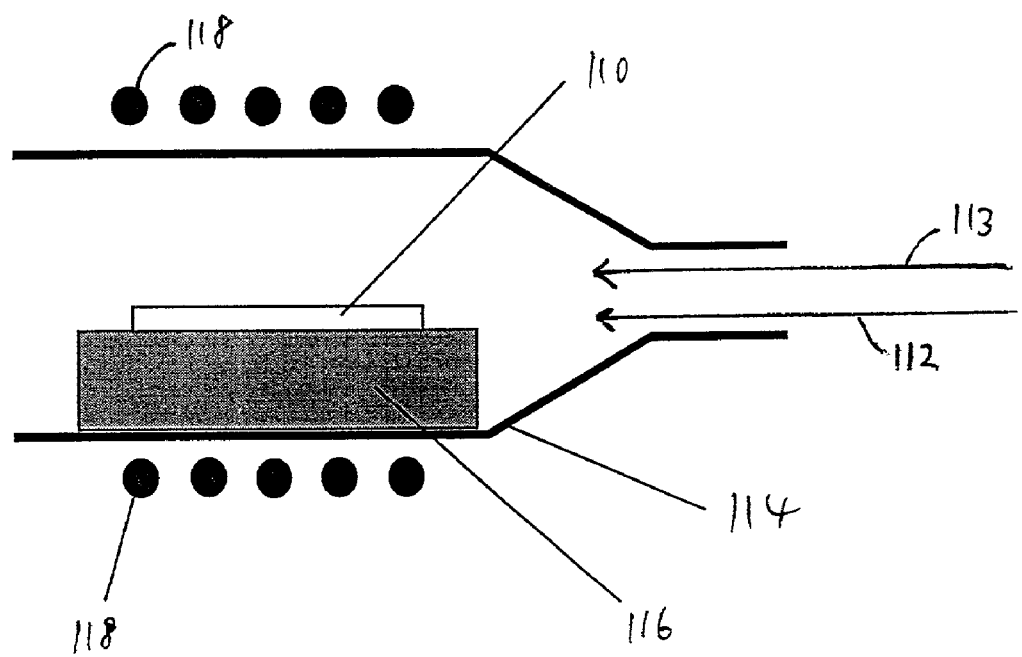
FIG. 1A is an illustration of a conventional epitaxial growth system for III-V nitrides.
Figure 1B:
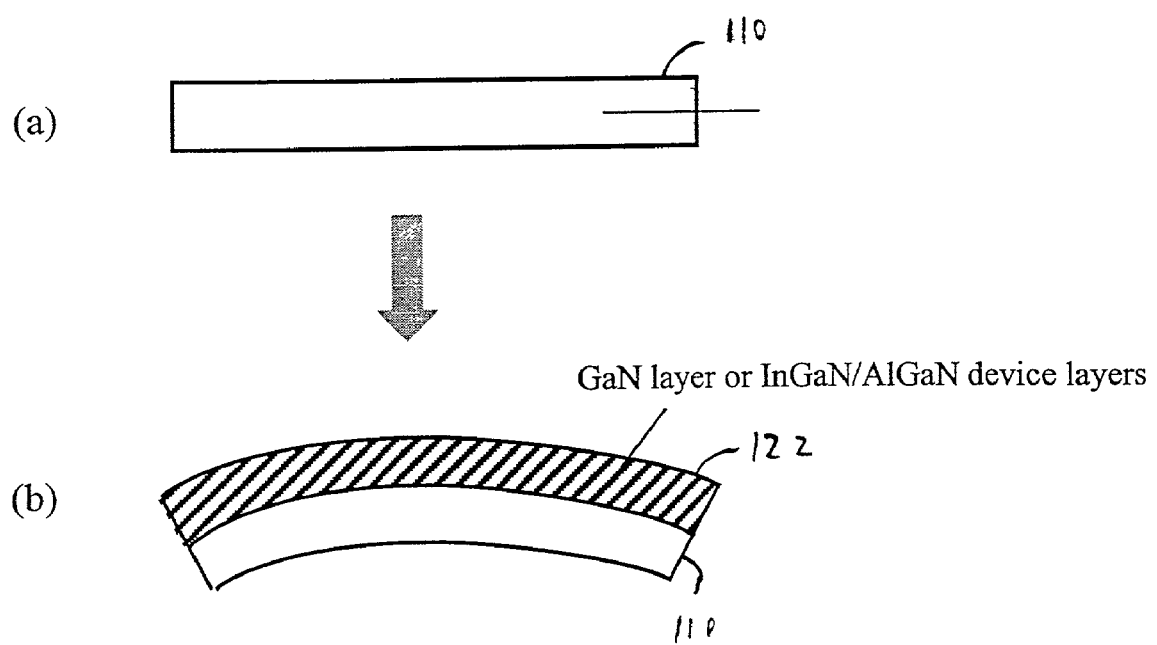
FIG. 1B is an illustration of a process flow of the conventional GaN growth on sapphire.

Accordingly, the present invention to provide a flat wafer for high yield processing of III-V nitride devices. The present invention provides a structure and method for overcoming many of the aforesaid limitations of the prior art.

In an exemplary embodiment, the present invention uses a layered substrate for III-V nitride epitaxial growth, in which (1) each layer has a different thermal expansion coefficient (TEC) and (2) the TECs among the various layers are matched in order to compensate for any bowing which might otherwise occur. For example, the bottom layer in a substrate may compensate for the thermal mismatch between the overgrown nitrides and the top layer in the substrate. An exemplary substrate may contain three or more layers among which at least two layers have different TECs. In the case of substrates that comprise two layers, (1) either the TEC of the top layer of the substrate is arranged to be larger than the coefficients of the epitaxial layer and the bottom layer of the substrate (2) or the TEC of the top layer of the substrate is arranged to be smaller than the coefficients of the epitaxial layer and the bottom layer of the substrate.

Device structures such as pn junctions for light emitting devices or transistor structures can be made on the layered substrate. The epitaxial layer can be separated from the substrate either by removing the whole substrate or by removing selectively the top layer of the substrate. The epitaxial layer and bottom layer can be formed on a substrate without cooling down to room temperature. A special growth system can be used for the formation of films on the both sides of the substrate. The layered substrate with bowing is heated up directly without any heat sink material between the substrate and the heat source. The reactant species for the growths are supplied separately on to the top surface and the bottom surface of the original substrate. The separation of the reactant species can be made by either a physical partition or inert gas flows.

The layered substrate which results from the process of the present invention provides a layer or structure that remains flat after subsequent epitaxial growths of semiconductors on the layered substrate. Thus, a flat epitaxial layer in accordance with the present invention permits precise patterning during device fabrication even at the peripheral area of the wafer, thereby resulting in high production yields. The direct heating provides uniform heating for the layered substrate which originally bows due to the thermal mismatch of the layers in the substrate. Supplying two sets of reactant species separately onto the both sides of the wafer enables the formation of the epitaxial layer and the bottom layer without cooling down to room temperature, thereby resulting in less crystal defects or micro cracks.

In a somewhat different application, the layered substrate of the present invention may be used to provide a first substrate for subsequent epitaxial growth of semiconductors. In such an arrangement, the first substrate comprises at least two layers which have different TECs. In accordance with the first substrate, an epitaxial layer is grown on the layered substrate. The bottom layers in the substrate compensate the thermal mismatch between the epitaxial layer and the top layer of the substrate. This allows for the formation of a flat epitaxial wafer after the epitaxial growth and a uniform mask patterning on the whole wafer with high yield of the device in production.

In an exemplary embodiment of the present invention, the epitaxial layer on the layered substrate consists of III-V nitride semiconductors, such as GaN, AlN, InGaN, AlGaN alloys. In such an arrangement, since no native GaN or III-V nitride alloy substrate is available, III-V nitride is usually grown on thermally mismatched substrates.

Conventionally, the best substrate is sapphire, which has a larger TEC than the nitride layer. TECs for GaN and sapphire are $5.46 \times 10^{-6}$/deg and $7.5 \times 10^{-6}$/deg, respectively. After the epitaxial growth of GaN film on a sapphire substrate, the wafer bows in a convex manner at room temperature due to the thermal mismatch. The use of the layered substrate in accordance with the present invention for subsequent III-V nitride growth enables the fabrication of a flat wafer after the growth of the epitaxial layers.

In at least some embodiments, it is preferable that one of the layer materials is selected from the group consisting of sapphire, silicon, silicon carbide, zinc oxide, gallium arsenide, gallium phosphide, indium phosphide, $LiGaO_2$, and $LiAlO_2$. These nine materials are used as substrates for III-V nitride epitaxial growth. Single crystalline III-V nitrides are grown on the substrates. Sapphire is well-known as the best current substrate for III-V nitrides. High quality single crystal substrate is available for Si, GaAs, GaP and InP. In addition, SiC, ZnO, LiGaO$_2$, and LiAlO$_2$ are nearly lattice-matched substrates for III-V nitrides on which III-V nitrides can be grown with less crystal defects.

In one exemplary arrangement of the present invention, it is preferable that the substrate includes two layers where the top layer which is attached to the epitaxial layer has a larger TEC than both the epitaxial layer and the bottom layer of the substrate. In the instance that the top layer of the substrate has a larger TEC than the epitaxial layer, the bottom layer, which is attached to the top layer and has a smaller TEC than the top layer, enables the formation of a flat wafer after the growth of the epitaxial layer. Without the bottom layer attached, the wafer bows in a convex manner after the growth of the epitaxial layer.

In an alternative arrangement, it is preferable that the substrate consists of two layers and the top layer which is attached to the epitaxial layer has smaller TEC than both the epitaxial layer and the bottom layer of the substrate. In such a case the top layer of the substrate has smaller TEC than the epitaxial layer, the bottom layer, which is attached to the top layer and has larger thermal expansion coefficient than the top layer, enables a flat wafer after growth of the epitaxial layer. Without the bottom layer attached, the wafer bows in a concave manner after the growth.

In still another exemplary arrangement, the epitaxial layer may comprise an III-V nitrides alloy where the substrate is selected from a group consisting of sapphire on silicon, sapphire on III-V nitrides alloy, sapphire on zinc oxide, and sapphire on silicon carbide. In the four combinations of the epitaxial layer and substrate, the top layer has either a larger or a smaller TEC than the epitaxial layer and bottom layer of the substrate. Thus, the use of the listed substrate structures results in a flat wafer with an epitaxial III-V nitride layer on it.

The method of the present invention can be used to result in a first semiconductor device. The first semiconductor device comprises a device layer on a layered substrate in which at least two layers have different TECs. In accordance with the first semiconductor device, the device is grown on the layered substrate. Since the bottom layers in the substrate compensate the thermal mismatch between the device layer and the top layer of the substrate, the resultant device structure is very flat without any bowing. This enables precise and reproducible mounting of the die into the package with high yield in production.

The present invention provides a first epitaxial growth method. The first epitaxial growth method comprises an epitaxial growth on a layered substrate in which at least two layers have different TECs, followed by a removal of the substrate after the growth. In accordance with this first exemplary epitaxial growth method, the epitaxial layer is separated from the substrate. The separated layer is free from the bowing caused by the thermal mismatch. Since some of the substrates for III-V nitride are less thermally or electrically conductive materials, the removal enables better thermal management in the device or lower series resistance in the device resulting in longer lifetime, high power operation, or low voltage operation.

In at least some arrangements of the present invention, it is preferable that the epitaxial layer is separated by the selective removal of the top layer of the substrate. The selective removal of the top layer enables a reuse of the bottom layer for another epitaxial growth. Thus, the production cost of the separated epitaxial layer can be reduced.

Still further, the present invention provides a second epitaxial growth method which comprises an epitaxial growth on a front side of a substrate at an elevated temperature and another film formation or epitaxial growth on the backside of the substrate before or after the front side growth without cooling down to room temperature. In accordance with this second epitaxial growth method, the front side growth and the back side growth are done without cooling down to room temperature. In case that a layer is grown on one side of the substrate and cooled down to room temperature, the wafer may bow with possible micro cracks or crystal defects in the grown layer. Thus, the second epitaxial growth method improves the crystal quality of the epitaxial layer by eliminating the cooling down process.

In a related aspect of the invention, it is also possible to form the two layers simultaneously. In such an arrangement, the simultaneous growths minimize the effect of the stress upon cooling down after the growth due to the thermal mismatch.

The present invention provides a third epitaxial growth method. The third epitaxial growth method comprises direct heating by a radiation source without any heat sink material of a layered substrate in which each layer has a different TEC. In accordance with the third epitaxial growth method, any bowed wafer can be heated up uniformly. The layered substrate may bow before the epitaxial growth due to the thermal mismatch of the layers in the substrate. The third epitaxial growth method enables uniform heating of such a bowed wafer resulting in uniform epitaxial growth on the substrate.

In an alternative arrangement, the present invention provides a further epitaxial growth system in which films can be grown on both sides of a substrate simultaneously. In such an arrangement, the substrate is placed so that each side of the substrate is not covered by any parts or susceptor blocks. Then, one set of reactant species are supplied on one side of the substrate and another set of reactant species are supplied onto the other side of the substrate, where the two sets of reactant species are separated by a physical partition or inert gas flows. These simultaneous growths minimize the effect of the stress upon cooling down after the growth due to the thermal mismatch among the epitaxial layers and the substrate. In at least some arrangements, it is preferable that both sets of the reactant species contain a nitrogen source and a group-III metal source, such that III-V nitrides can be grown on both sides of the substrate simultaneously, thereby resulting in a flat epitaxial wafer at room temperature without crystal defects and micro cracks. Alternatively, one set of the reactant species may contain a nitrogen source and a group-III metal source, and another set of the reactant species may contain a silicon source.

EMBODIMENTS

First Embodiment

Figure 2A:
FIG. 2A is an illustration of a process flow of the flat epitaxial wafer in which GaN is grown on sapphire on silicon as one embodiment of the present invention.
Figure 2A:
Figure 2A:
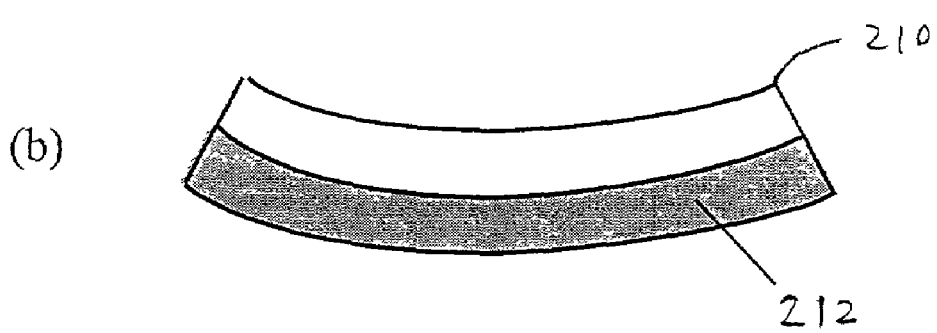
Figure 2A:
Figure 2A:
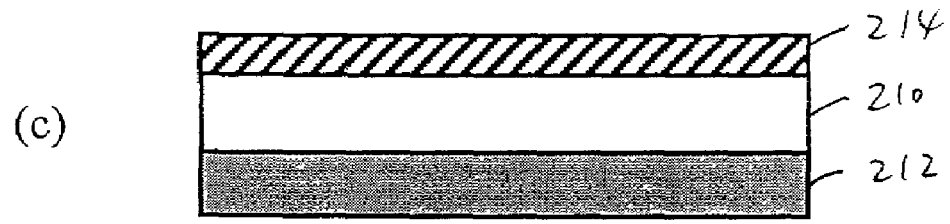

Referring first to FIG. 2A, one embodiment of the process of the present invention may be understood in greater detail. In particular, FIG. 2A schematically illustrates a process flow of a flat epitaxial wafer in which silicon 212 is grown on one side of a sapphire substrate 210 such as by chemical vapor deposition at around 1000° C. Substrate 210 typically is 300 μm thick. The silicon 212 may be attached by wafer bonding at an elevated temperature. Due to the thermal mismatch between sapphire and silicon, the wafer bows in a convex manner after cooling down as shown in part (b) of FIG. 2A.

Thereafter, a GaN, InGaAlN, or InGaN, or AlGaN alloy-based device layer 214 is grown on the other side of substrate 210 by, for example, metal organic chemical vapor deposition (MOCVD) at around 1000° C. A low temperature AlN buffer may be grown prior to the high temperature growth to reduce the crystal defects or surface roughness. Typically, trimethyl gallium(TMGa) and ammonia ($NH_3$) are supplied for the GaN growth. In addition, trimethyl aluminum(TMAl) and trimethyl indium (TMIn) are supplied for the alloy growth.

After the growth, the epitaxial wafer is very flat because the TEC of GaN is smaller than sapphire, and, therefore, the epitaxial growth helps to reduce the bowing of the original sapphire on silicon. By carefully adjusting the various layer thicknesses, the bowing characteristic of prior art processes can be virtually eliminated. Epitaxial wafers obtained through this process enable precise mask patterning on an entire wafer, even those of large diameter, thereby resulting in high yields during device production.

Figure 2B:
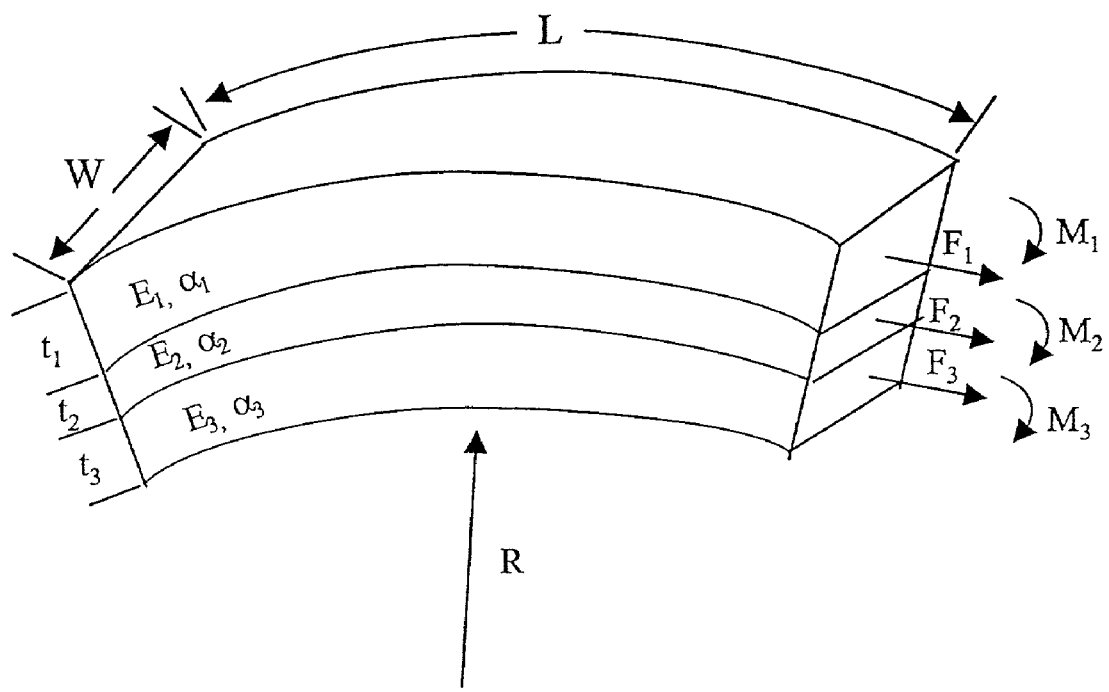
FIG. 2B is an illustration of the basic model of the calculation of wafer bowing and stresses for the thermally mismatched system.

Referring to FIG. 2B, the above mentioned wafer bowing can be calculated by using simple modeling proposed by Olsen et al. (*J. Appl. Phys.*, 48 (1977) 2543). FIG. 2B, schematically illustrates a basic model (hereinafter, the Olsen model) of the calculation. And the following equations are used for the calculation of the bowing.

$$\sum_{i=1}^{n} F_i = 0$$

$$\sum_{i=1}^{n} M_i = \sum_{i=1}^{n} \left( \frac{E_i t_i^3 W}{12R} + F_i \left( \sum_{j=1}^{n} t_j - \frac{1}{2} t_i \right) \right) = 0$$

$$\varepsilon_i - \varepsilon_{i+1} = \Delta T(\alpha_i - \alpha_{i+1}) = \frac{F_{i+1}}{E_{i+1} t_{i+1} W} - \frac{F_i}{E_i t_i W} - \frac{t_i + t_{i+1}}{2R}$$

L is the length of the wafer, and W is the width of the wafer. Thickness $t_i$, Young modulus $E_i$ and TEC $\alpha_i$ are given for each layer. $F_i$ and $M_i$ are the force and the momentum applied to each layer due to the thermal mismatch, respectively. R is the radius of the bowing of the wafer. In the Olsen model, the sum of the forces and the sum of the momentums are assumed to be zero, and the distortion of the crystal at the interface is assumed to be caused only by the thermal mismatch.

Figure 2C:
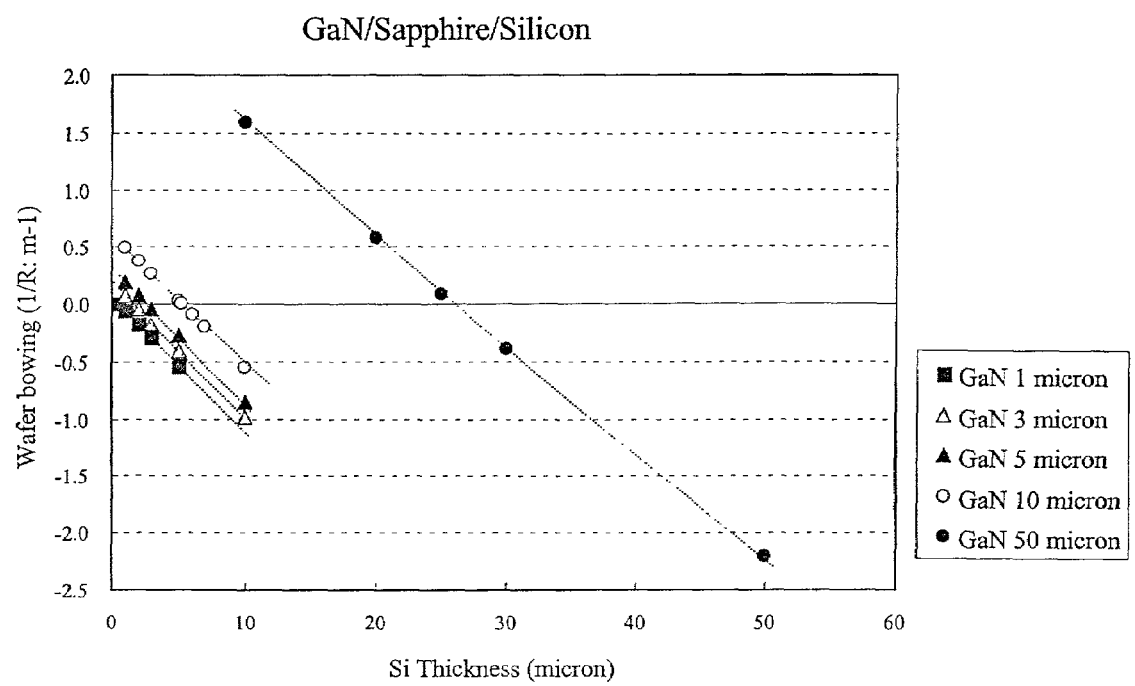
FIG. 2C is calculation results of bowing of GaN/sapphire/silicon system after the growth, in which the thickness of GaN and silicon is varied.

Referring to FIG. 2C, based on the Olsen model, wafer bowing after the growth is calculated for the GaN/sapphire/silicon structure, and the calculation results are shown in FIG. 2C. It is assumed that both GaN and silicon are formed at 1000° C. Also, sapphire substrate 210 is 300 μm thick. It can be seen that a flat wafer can be obtained by adjusting the silicon thickness on the back side of sapphire substrate 210. The optimized silicon thickness may depend on the formation temperature of the silicon, in which case the optimal silicon thickness for compensating for bowing may need to be adjusted for a particular process. These adjustments can be readily made by those skilled in the art familiar with semiconductor wafer processing.

Table 1 is a summary of the material property data for the possible layers to be used for III-V nitride growths. The data are used to obtain the results shown in FIGS. 1C and 2C.

TABLE 1

|  | Young modulus (Gpa) | Thermal Expansion Coefficient ($10^{-6}$/deg) |
| --- | --- | --- |
| GaN | 196 | 5.45 |
| Sapphire | 425 | 7.5 |

TABLE 1-continued

|  | Young modulus (Gpa) | Thermal Expansion Coefficient ($10^{-6}$/deg) |
| --- | --- | --- |
| Si | 156 | 2.6 |
| SiC | 414 | 4.4 |
| ZnO | 124 | 2.9 |

Second Embodiment

Figure 3:
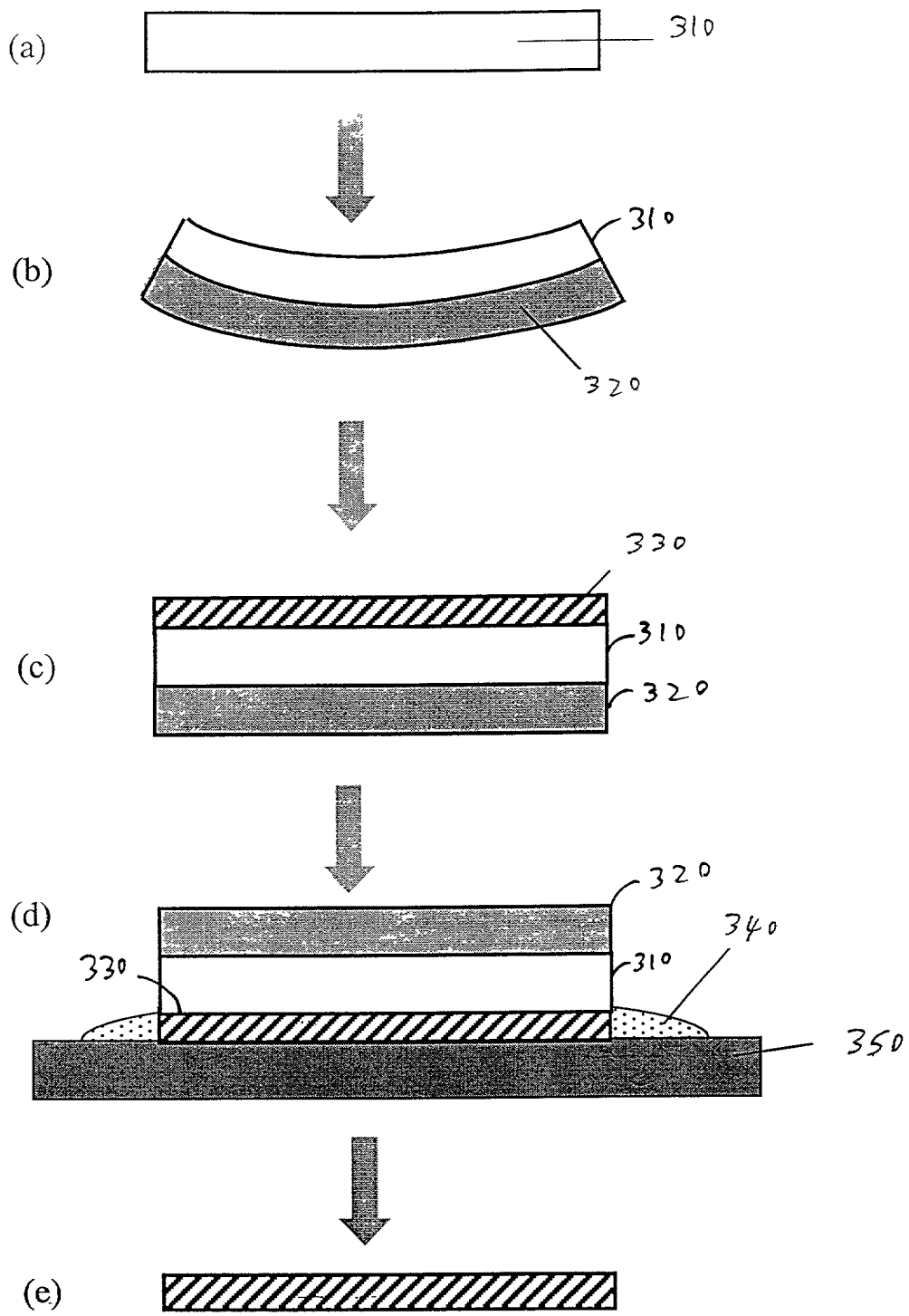
FIG. 3 is an illustration of a process flow of one embodiment of the flat epitaxial wafer of the present invention in which GaN is grown on sapphire on silicon and the GaN layer is separated by mechanical polishing of the sapphire on silicon

Referring next to FIG. 3, a process flow of the flat epitaxial GaN layer of a second embodiment is schematically shown. The flat epitaxial wafer of GaN/sapphire/silicon is formed according to the process flow shown in FIG. 2A in which (1) silicon 320 is attached on the back side of a sapphire substrate 310 as shown in part (b) of FIG. 3 and (2) GaN layer or InGaN/AlGaN device layers 330 are grown on the front side of substrate 310 as shown in part (c) of FIG. 3. Typically, sapphire substrate 310 is 300 μm thick. In addition, bowing of the wafer occurs after cooling down the wafer, as shown in part (b) of FIG. 3.

Then the flat wafer is attached to a wafer holder 350 using bonding wax 340 as shown in part (d) of FIG. 3 for subsequent mechanical polishing of the sapphire/silicon, as shown in part (e) of FIG. 3. Since the wafer before polishing is flat, the wafer can be attached easily to wafer holder 350. During the mechanical polishing process, stresses in the film will tend to cause the wafer to bow again. To avoid the wafer removal from the holder during the polishing, a bonding wax 340 having strong adhesion capability can be used. By such an approach, GaN layer 330 free from sapphire can be obtained which shows better thermal or electrical conductivity, thereby resulting in high performance devices for high power or low voltage operation.

Third Embodiment

Figure 4:
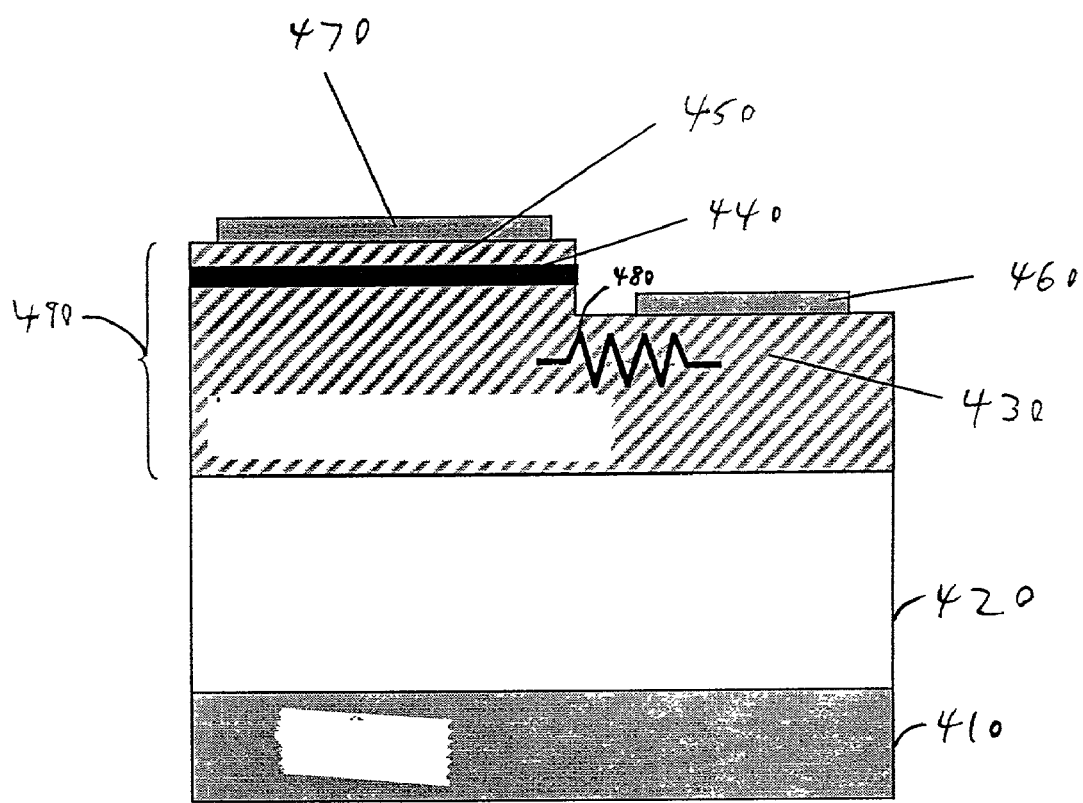
FIG. 4 is an illustration of one embodiment of a semiconductor device produced in accordance with the method of the present invention in which InGaN/GaN/AlGaN light emitting diode layers are grown on sapphire on silicon.

Referring next to FIG. 4, a device according to the process of the present invention is shown. In particular, FIG. 4 shows the cross section of an InGaN/AlGaN light emitting diode (LED) on a sapphire/silicon substrate. A pn junction structure is grown on a sapphire substrate 420, which is attached to silicon 410. The wafer and the chip are very flat so that the epitaxial layer has a thickness 490 more than a few microns in order to maintain reasonable flatness.

Since sapphire substrate 420 is an insulating material, a p-type layer 450 and an active layer 440 are selectively etched, and n-electrode 460 and p-electrode 470 are formed. Typically, p-type layer 450 is composed of GaN or AlGaN. Typically, active layer 440 is composed of InGaN. The series resistance 480 of the LED can be low with a relatively thick n-type layer 430 underneath active layer 440. Typically, n-type layer 430 is composed of AlGaN or GaN.

LED's fabricated by such an approach can be operated at a lower voltage. In addition, the chip die can be bonded very precisely onto the package.

Fourth Embodiment

Figure 1C:
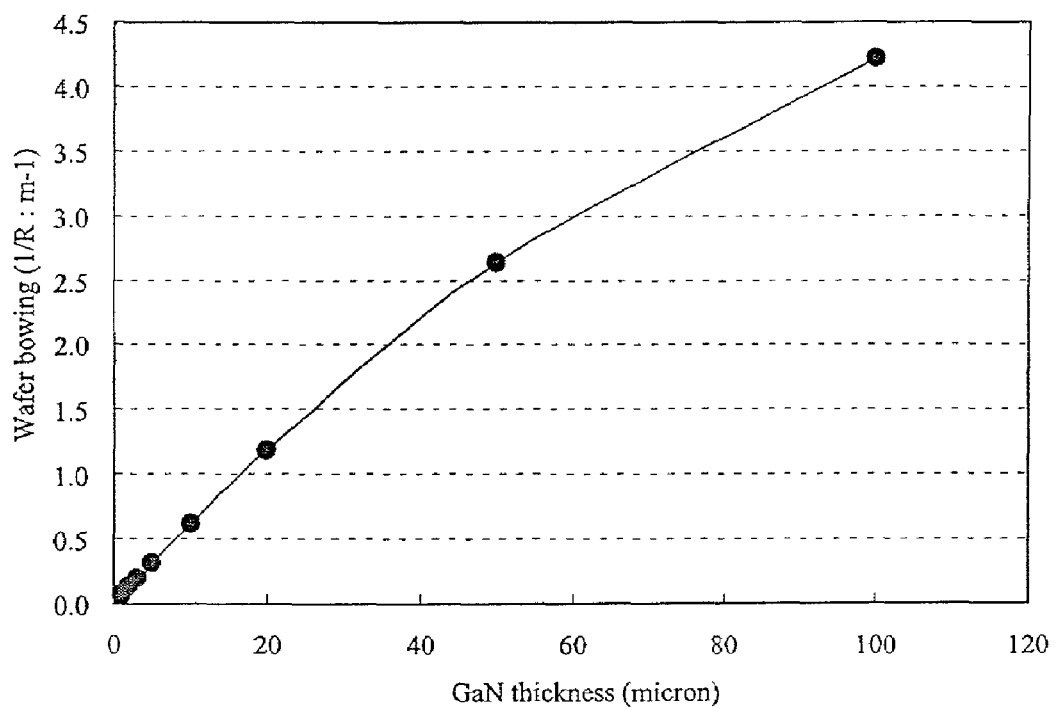
FIG. 1C is calculation results of bowing of GaN/sapphire system after the growth, in which the thickness of GaN is varied.
Figure 1D:
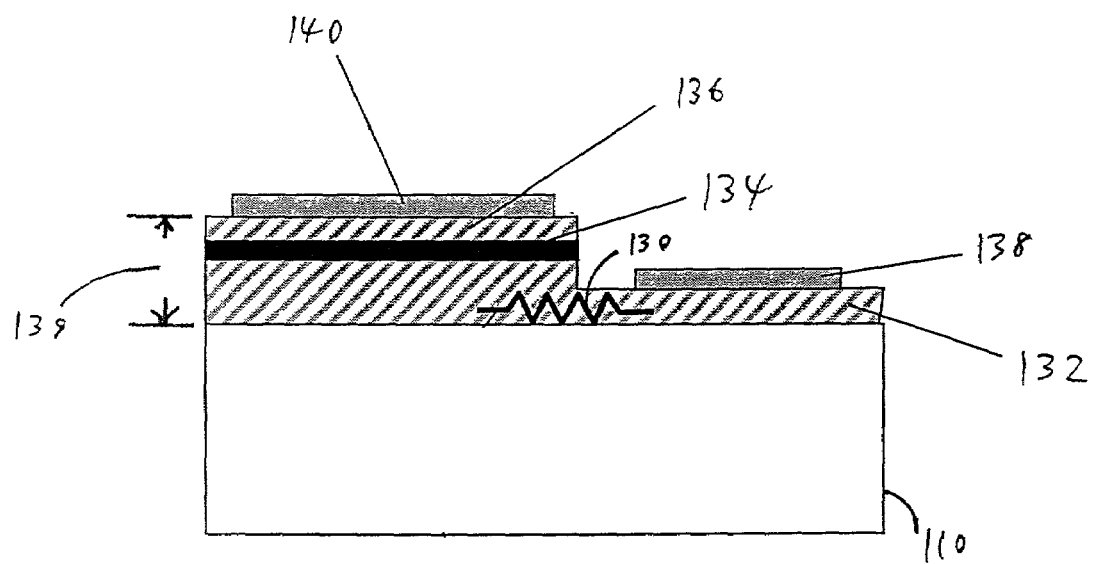
FIG. 1D is an illustration of a conventional semiconductor device in which InGaN/GaN/AlGaN light emitting diode layers are grown on sapphire.
Figure 5:
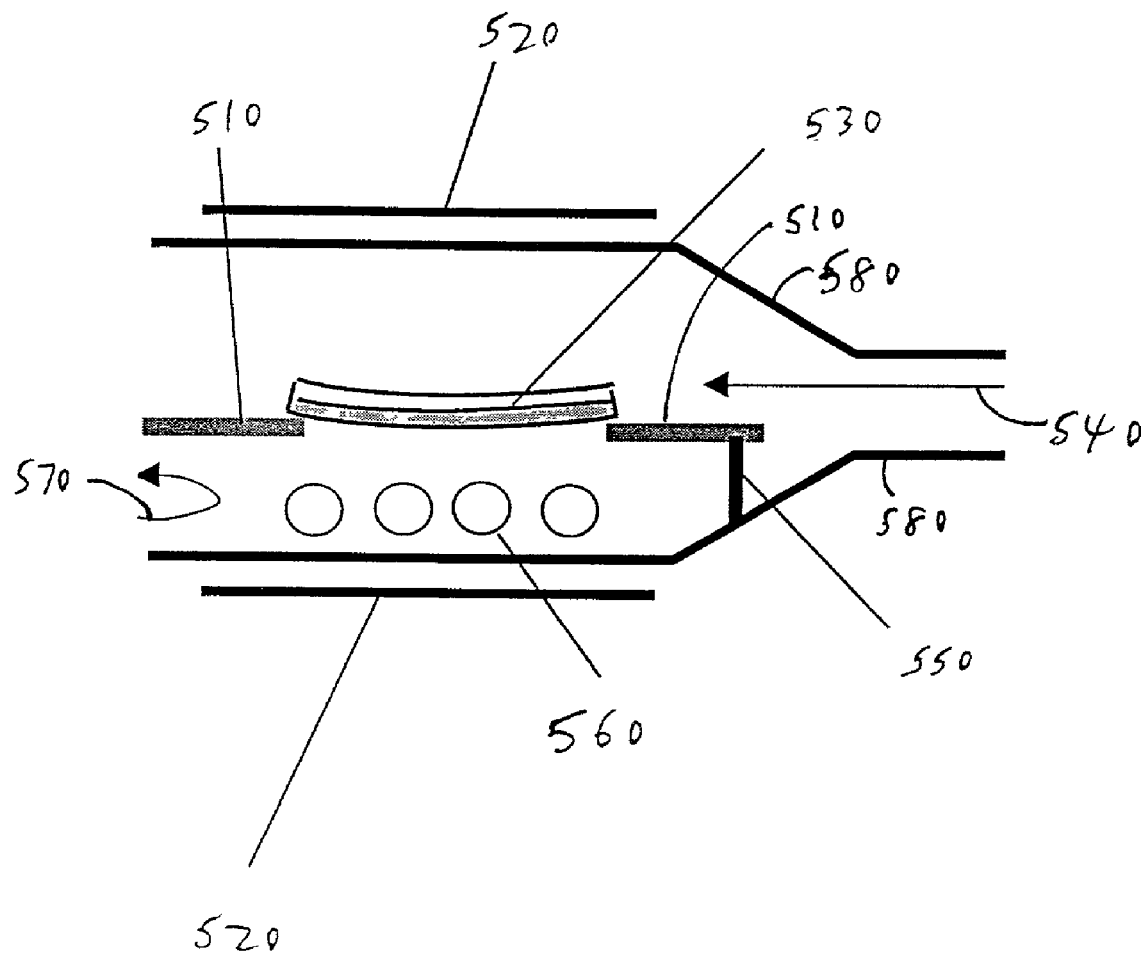
FIG. 5 is an illustration of an epitaxial growth system in accordance with the present invention in which the substrate is directly heated.

FIG. 5 illustrates an alternate embodiment in which a MOCVD system for epitaxial growth of III-V nitrides is shown. A sapphire on silicon substrate 530 bowed in a concave manner is placed on a wafer holder 510 which has a big opening so that the wafer can be heated directly from the bottom by a radiation source 560. The radiation source 560 may be infrared lamps. A reflector 520 is also placed outside of the reactor 580, and an inert gas flow 570 is supplied around the radiation source 560. Compared with a conventional MOCVD system using heat sink material as shown in FIG. 1A, the present system enables uniform heating of the bowed wafer. Reactant gases 540 such as trimethyl gallium(TMGa), TMAl, TMIn, and ammonia (NH$_3$) are supplied on to the sapphire surface. A partition 550 separates the reactant gas flow 540 from the inert gas flow 570.

Fifth Embodiment

Figure 6:
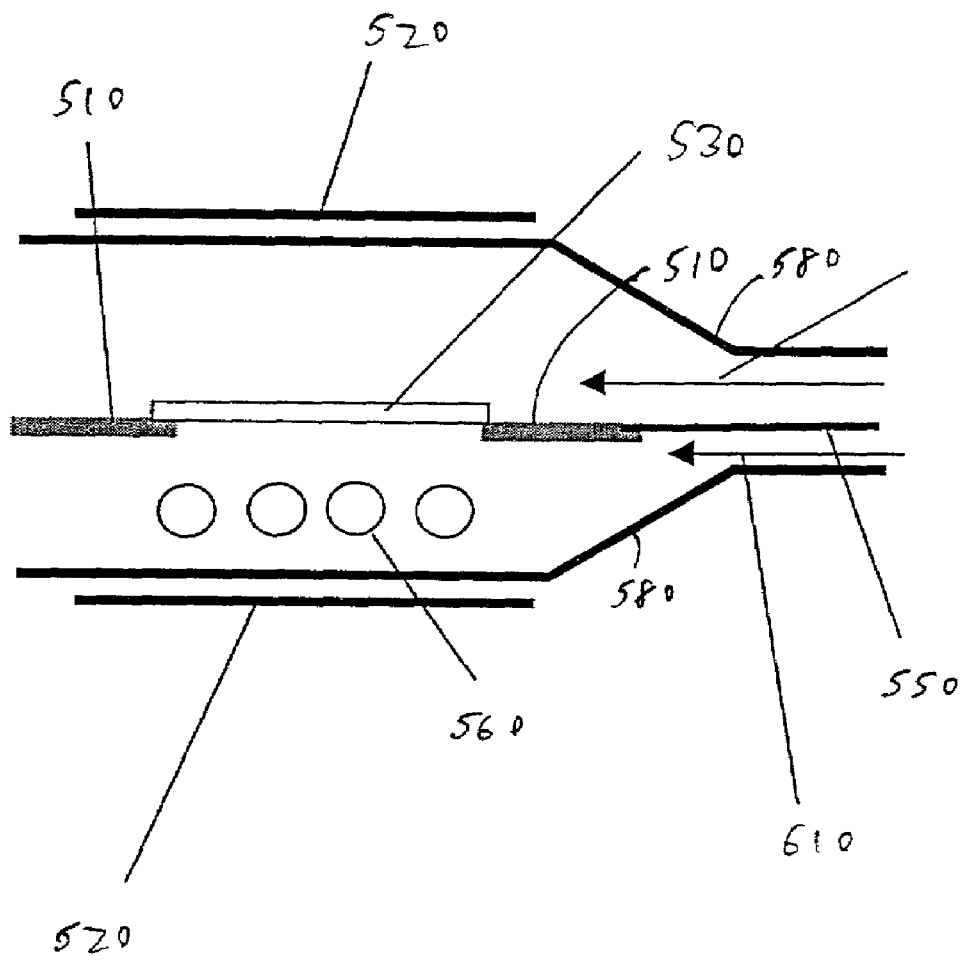
FIG. 6 is an illustration of an alternate arrangement of an epitaxial growth system in which the two sets of reactant species are supplied separately on to the both sides of the substrate as one embodiment of the present invention.

Referring next to FIG. 6, a fifth arrangement illustrates a MOCVD system for epitaxial growth of III-V nitrides, wherein the same direct heating system as seen in FIG. 5 is used in the system. In addition to the system as shown in FIG. 5, however, another set of reactant gases 610 is supplied on to the backside of the sapphire substrate 530. Sapphire substrate 530 is placed on wafer holder 510, and epitaxial layers are grown on both sides of sapphire substrate 530 simultaneously with direct heating using radiation source 560. The back side growth can be silicon or III-V nitrides. Reflector 520 is also placed outside of reactor 580, and reactant gases 540 such as trimethyl gallium(TMGa), TMAl, TMIn, and ammonia (NH$_3$) are supplied on to the sapphire surface. The reactant gases for the backside growth 610 may contain SiH$_4$ for silicon or sets of group-III metal and nitrogen sources, such as trimethyl gallium(TMGa), TMAl, TMIn, and ammonia (NH$_3$) for GaN. The simultaneous growths reduce crystal defects or micro cracks in the epitaxial layers because no thermal cycling is applied in between the sets of the growths. The above two sets of the reactant gases 540 and 610 are separated by physical partition 550 as seen in FIG. 6, or inert gas flows.

CONCLUSION

The present invention relates to layered substrates, and more particularly relates to method for compensating for stresses imposed on substrates when used for subsequent epitaxial growth of III-V nitride semiconductors.

Having fully described a preferred embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims.

I claim:

1. An epitaxial growth method comprising:
growing an epitaxial layer on a layered substrate, wherein the layered substrate comprises sapphire on silicon exhibiting bowing in a convex manner and the epitaxial layer comprises group III nitrides, and the epitaxial layer is grown on the opposite side of the sapphire from that of the silicon layer after formation of the silicon layer.

2. The epitaxial growth method of claim 1 further comprising the step of removing the layered substrate after growing the epitaxial layer.

3. The epitaxial growth method of claim 2 wherein the step of removing comprises mechanical polishing.

4. The epitaxial growth method of claim 1 wherein a process of forming said layered substrate includes a heating step, wherein said layered substrate exhibits a bowing after being cooled down from said heating step.

5. The epitaxial growth method of claim 1, wherein the thickness of the silicon is less than 6 microns, the thickness of the epitaxial layer is less than 3 microns and the wafer bowing is less than 0.5 m$^{-1}$.

6. The epitaxial growth method of claim 1, wherein the thickness of the silicon is from 2 to 10 microns, the thickness of the epitaxial layer is from 3 to 10 microns and the wafer bowing is less than 0.5 m$^{-1}$.

7. The epitaxial growth method of claim 1, wherein the thickness of the silicon is from 20 to 30 microns, the thickness of the epitaxial layer is from 40 to 60 microns and the wafer bowing is less than 0.5 m$^{-1}$.

8. The epitaxial growth method of claim 1, wherein a surface of the epitaxial layer of the group III nitrides is not degraded by a reactant species for the formation of the silicon layer on the opposite side of the sapphire.

9. The epitaxial growth method of claim 8, wherein a gas source containing nitrogen is used for the formation of the epitaxial layer of the group III nitrides.

10. An epitaxial growth method comprising the step of:
growing an epitaxial layer on a layered substrate, wherein the layered substrate comprises sapphire on silicon exhibiting bowing in a convex manner and the epitaxial layer comprises group III nitrides,
wherein the epitaxial layer is grown on the opposite side of the sapphire from that of the silicon layer after formation of the silicon layer, and
flattening the epitaxial layer having a III-V nitrides alloy and the layered substrate by growing the epitaxial layer on the layered substrate,
wherein the formation of the epitaxial layer flattens the wafer.

11. The epitaxial growth method of claim 10, wherein an AlN buffer layer is grown on the layered substrate prior to growing the epitaxial layer thereon, and
the AlN buffer layer is grown at a temperature lower than that of the epitaxial layer.

* * * * *